United States Patent [19]

Nakamura

[11] Patent Number: 5,801,572
[45] Date of Patent: Sep. 1, 1998

[54] POWER MOSFET

[75] Inventor: Hidetake Nakamura, Tokyo, Japan

[73] Assignee: NEC Corporation, Tokyo, Japan

[21] Appl. No.: 604,891

[22] Filed: Feb. 22, 1996

[30] Foreign Application Priority Data

Feb. 24, 1995 [JP] Japan ................. 7-036674

[51] Int. Cl.$^6$ ............................. H03K 17/687
[52] U.S. Cl. ............. 327/434; 327/437; 327/427; 327/389
[58] Field of Search ............. 327/427, 434, 327/365, 382, 388, 389, 437

[56] References Cited

U.S. PATENT DOCUMENTS 5,422,588   6/1995   Wynne .......................... 327/427

OTHER PUBLICATIONS

H. Namiki et al., "Effect of Gate Resistance on the Efficiency of the MOSFET Synchronous Rectifier" Denshi Joho Tsushin Gakkai Shuki Taikai, V. 1991, B–532, pp. 3–251.

N. Murakami et al., "Circuit Design Consideration of MOSFET Synchronized Rectifier", Denshi Joho Tsushin Gakkai Syunki Zenkodu Taikai, V. 1989, B–956, pp. 3–356.

"Power MOSFET ", NEC Data Book, V. 1994, pp. 982–983.

*Primary Examiner*—Timothy P. Callahan
*Assistant Examiner*—Dinh Le
*Attorney, Agent, or Firm*—Scully, Scott, Murphy & Presser

[57] ABSTRACT

A power MOSFET includes common source and drain terminals and a selection circuit. The sources and drains of a plurality of insulated gate field-effect transistors are respectively connected in parallel to the common source and drain terminals. The selection circuit selectively connects the gates of the insulated gate field-effect transistors to a gate terminal common to a source.

2 Claims, 10 Drawing Sheets

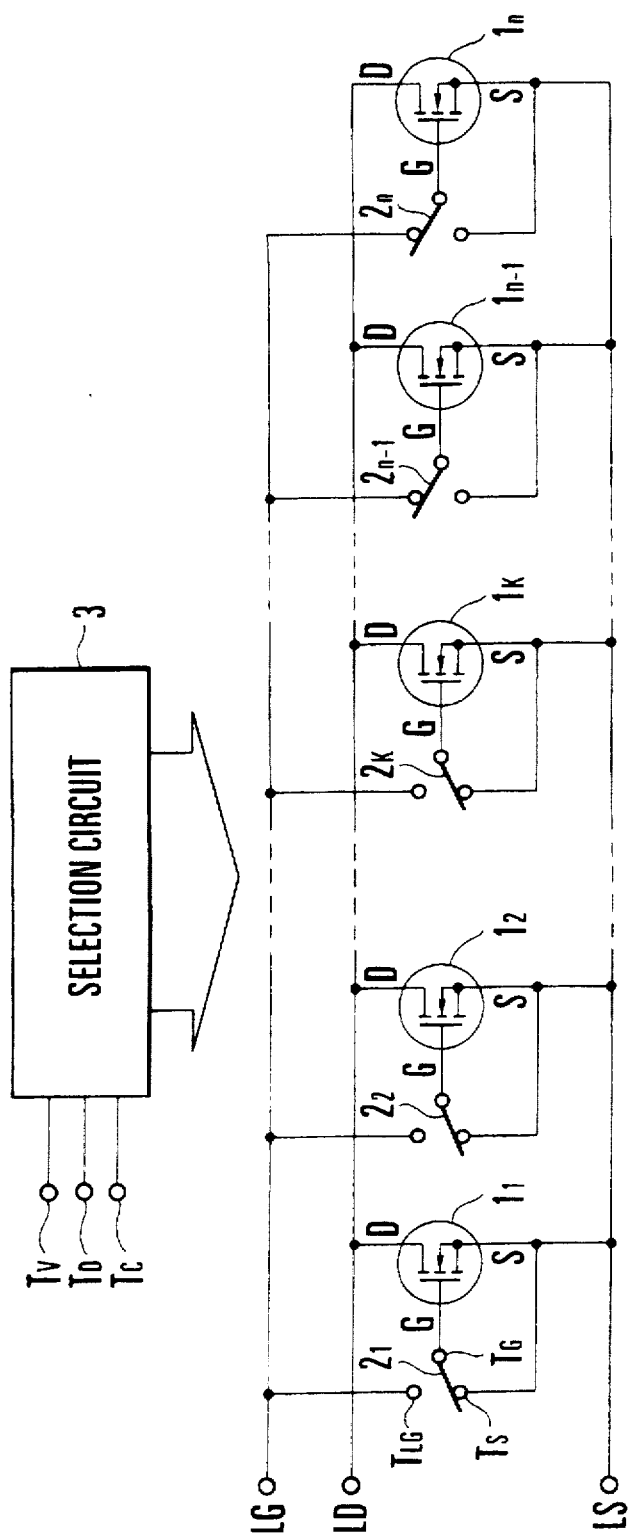
F I G. 1

FLOATING GATE CONTROL SIGNAL

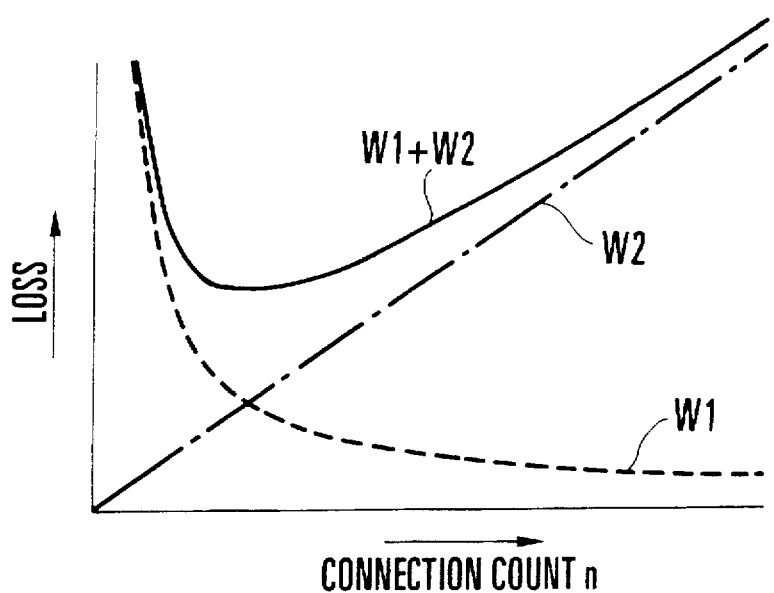
F I G. 5
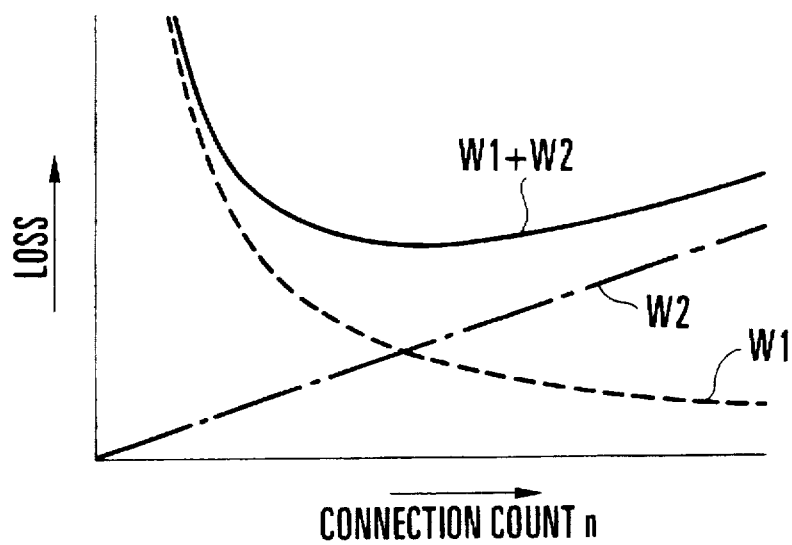
F I G. 6

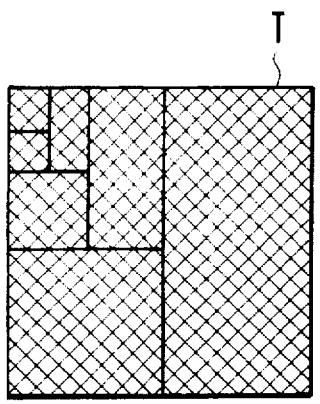
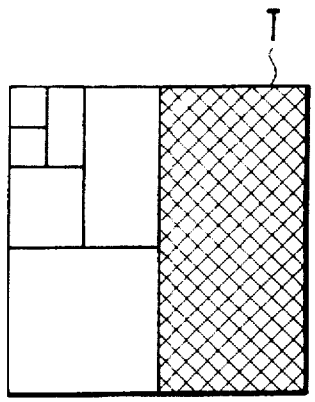
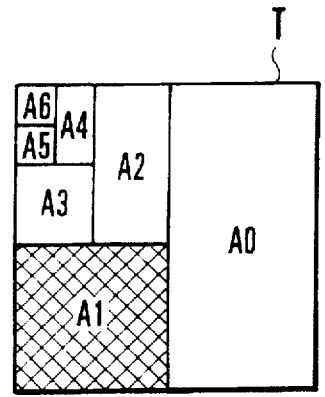
F I G. 8A     F I G. 8B     F I G. 8C
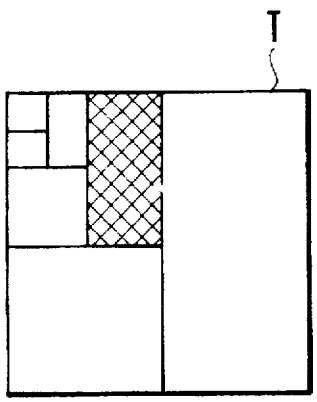
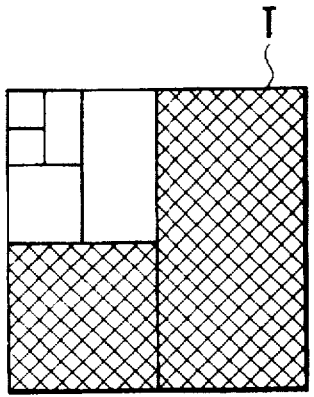
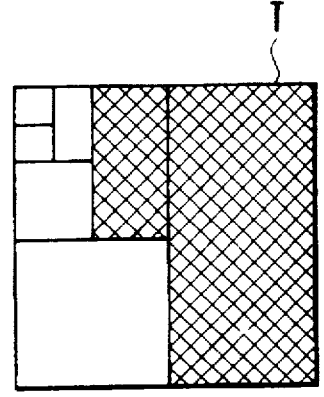
F I G. 8D     F I G. 8E     F I G. 8F
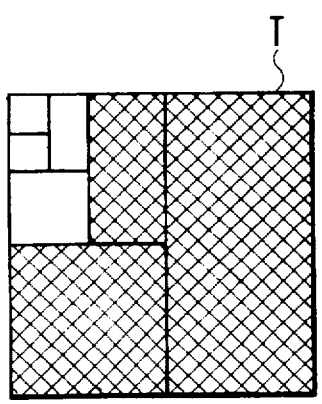
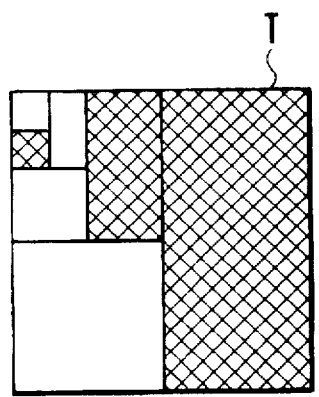
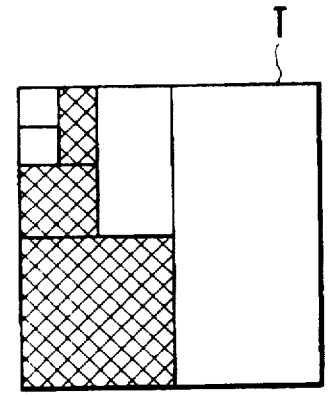
F I G. 8G     F I G. 8H     F I G. 8I

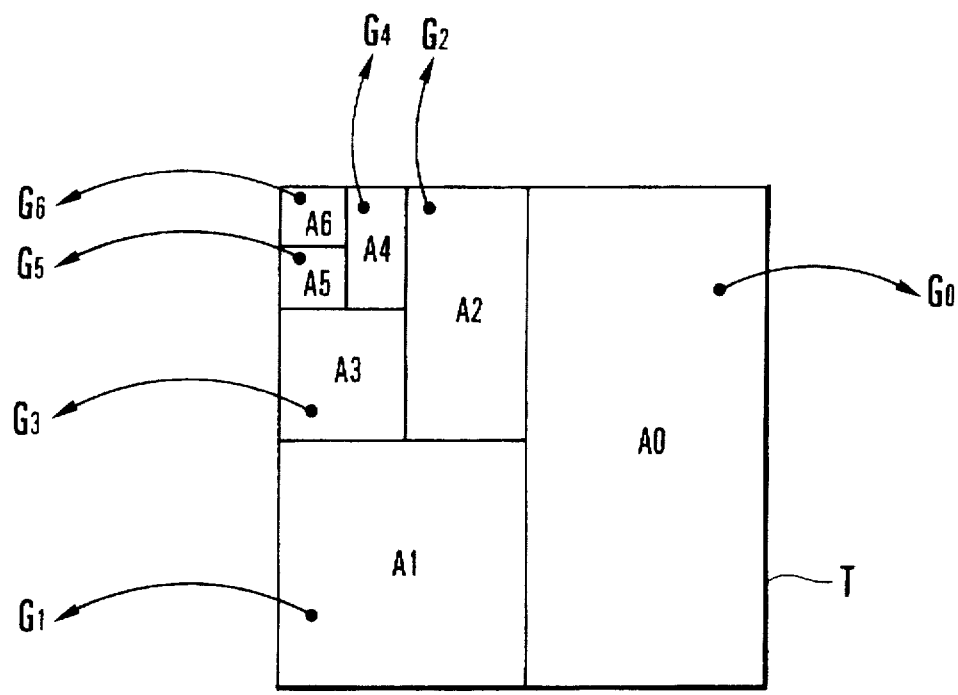
F I G. 9A
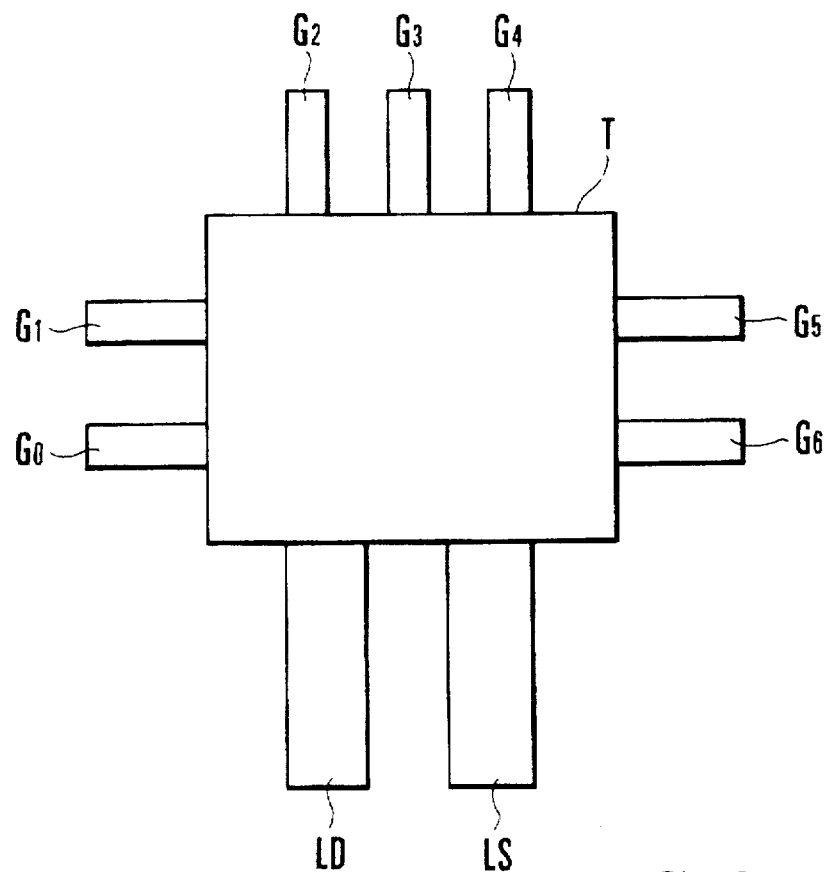
F I G. 9B

POWER MOSFET

BACKGROUND OF THE INVENTION

The present invention relates to a power MOSFET constituted by many insulated gate field-effect transistors (to be referred to as MOSFETs hereinafter) connected in parallel with each other and designed to perform. e.g., power control.

FIG. 11 shows a standard forward converter using a general diode as a secondary rectifying device of a switching power supply. Referring to FIG. 11, a MOSFET 13 is repeatedly turned on and off by an oscillator 12. When this MOSFET 13 is ON, a current I1 flows in the primary side of a transformer 14, and a voltage corresponding to the turn ratio of the transformer 14 is generated at the secondary side. As a result, a current I2 is supplied from a diode 20 to a load 19 via a coil 17.

When the MOSFET 13 is OFF, the current I1 to the primary side of the transformer 14 is cut off, but the current I2 is supplied to the load 19 via a diode 21 owing to the energy stored in the coil 17 on the secondary side.

In this arrangement, power is wasted because of a voltage drop occurring at the diodes 20 and 21, resulting in deterioration in efficiency.

FIG. 12 shows a switching power supply using MOSFETs 15 and 16 in place of the diodes 20 and 21 in FIG. 11. Referring to FIG. 12, a MOSFET 13 is repeatedly turned on and off by an oscillator 12. When this MOSFET 13 is on, a current I1 flows in the primary side of a transformer 14, and a voltage corresponding to the turn ratio of the transformer 14 is generated at the secondary side. In this case, since the MOSFET 15 is turned on, and the MOSFET 16 is turned off, a current I2 flows through the following route: coil 17→load 19→MOSFET 15.

When the MOSFET 13 is turned off, the current to the primary side of the transformer 14 is cut off, but the current I2 flows through the following route: coil 17→load 19→MOSFET 16, owing to the energy stored in the coil 17 because the MOSFET 15 is turned off, and the MOSFET 16 is turned on.

In this arrangement, as the resistance between the drain and the source during an ON period of each of the MOSFETs 15 and 16 decreases, the wasteful power consumption decreases. As a result, an improvement in efficiency can be attained. Such a phenomenon has already been known (Murakami et al., "Circuit Design Consideration of MOSFET Synchronized Rectifier" PROCEEDINGS OF THE 1989 IEICE SPRING CONFERENCE, B-956, and Namiki et al. "Effect of Gate Resistance on the Efficiency of the MOSFET Synchronous Rectifier" PROCEEDINGS OF THE 1991 IEICE FALL CONFERENCE, B-532).

The MOSFETs 15 and 16 used on the secondary side of the transformer 14 in FIG. 12 are constituted by many small MOSFETs $1_1, 1_2, \ldots, 1_k, \ldots, 1^{n-1}, 1_n$ whose sources S, drains D, and gates G are respectively connected in parallel to a source interconnection LS, a drain interconnection LD, and a gate interconnection LG (NEC: power MOSFET data book, 1994, pp. 892-983).

As described above, since the MOSFETs 15 and 16 used on the secondary side of the transformer 14 are constituted by the many small MOSFETs $1_1, 1_2, \ldots, 1_k, \ldots, 1_{n-1}, 1^n$ connected in parallel with each other, a decrease in resistance between the drain D and the source S can be attained to allow the power supply circuit to handle a large current.

In the above conventional switching power supply circuit, although the MOSFETs 15 and 16 are constituted by the many MOSFETs $1_1$ to $1_n$ connected in parallel with each other to decrease the resistance between the drain D and the source S so as to allow the power supply circuit to handle a larger current, the capacitance between the gate G and the source S must be charged/discharged for every switching operation to drive each gate G.

Since a decrease in the resistance between the drain D and the source S is attained, the loss caused by the resistance between the drain D and the source S decreases. However, the drive loss caused by charging/discharging operations of the capacitance between the gate G and the source S increases. Letting I2 be the current flowing in the secondary side circuit of the transformer 14, RON be the ON resistance between the drain D and the source S in each of the MOSFETs 15 and 16, Cin be the capacitance between gate G and the source S, V2 be the voltage between the gate G and the source S, and f be the switching frequency, a loss W1 caused by the ON resistance between the drain D and the source S is given by $$W1 = I2^2 \cdot RON \tag{1}$$

A loss W2 caused by the capacitance between the gate G and the source S is given by $$W2 = Cin \cdot V2^2 \cdot f \tag{2}$$

Assume that this power MOSFET is constituted by n small MOSFETs $1_1$ and $1_n$, and the ON resistance between the drain D and the source S and the capacitance between the gate G and the source S of each of the small MOSFETs $1_1$ to $1_n$ are respectively represented by RON' and Cin'. In this case, the ON resistance RON is 1/n times the ON resistance RON', and the capacitance Cin is n times the capacitance Cin'.

Equations (1) and (2) are therefore rewritten as follows:

$$W1 = I2^2 (RON' \cdot 1/n) \tag{1'}$$

$$W2 = (Cin' \cdot n) \cdot V2^2 \cdot f \tag{2'}$$

That is, the value of loss W1+loss W2 is minimized according to the value of the connection count n, as shown in FIG. 14. Under the present conditions, however, the value of the connection count n is fixed for each type of MOSFET, and it is difficult to select optimal MOSFETs in accordance with various application circuits.

SUMMARY OF THE INVENTION

The present invention has been made to solve the above problems, and has as its object to provide a power MOSFET which can minimize a loss caused by a resistance between a drain and a source and a capacitance between a gate and the source and can be suitably applied to various application circuits.

It is another object of the present invention to provide a power MOSFET which can improve the power efficiency by selecting and connecting the optimal number of insulated gate EFTs for minimization of a loss.

In order to achieve the above objects, according to the present invention, there is provided a power MOSFET comprising common source and drain terminals to which sources and drains of a plurality of insulated gate field-effect transistors are respectively connected in parallel, and selection means for selectively connecting the gates of the insulated gate field-effect transistors to a gate terminal common to a source.

BRIEF DESCRIPTION OF THE DRAWINGS

FIG. 1 is a circuit diagram showing the arrangement of a power MOSFET according to an embodiment of the present invention;

FIG. 5 is a graph showing the relationship between the loss and a connection count of small MOSFETs according to the present invention;

FIG. 6 is a graph showing the relationship between the loss and a connection count of small MOSFETs according to the present invention;

FIGS. 8A to 8I are views showing various patterns indicating how the small MOSFETs according to the present invention are operated in units of blocks;

FIGS. 9A and 9B are views showing the structures of small MOSFETs according to the present invention;

DESCRIPTION OF THE PREFERRED EMBODIMENTS

The embodiments of the present invention will be described in detail below with reference to the accompanying drawings.

Figure 12:
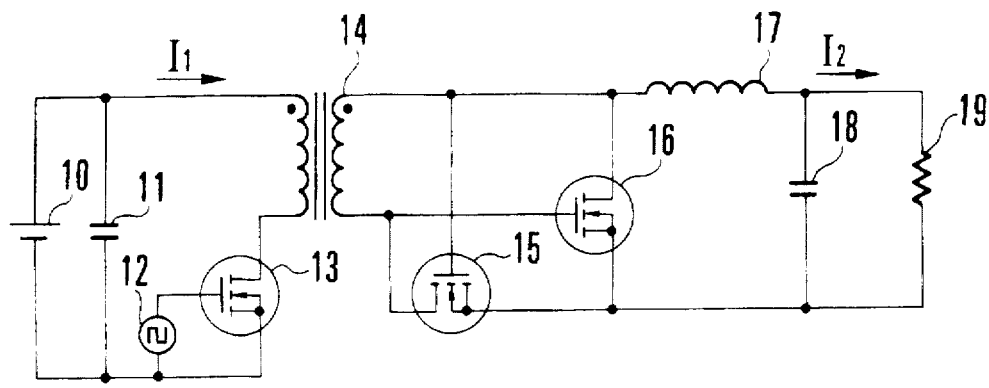
FIG. 12 is a circuit diagram showing the arrangement of a conventional switching power supply using a MOSFET as a rectifying device.
Figure 13:
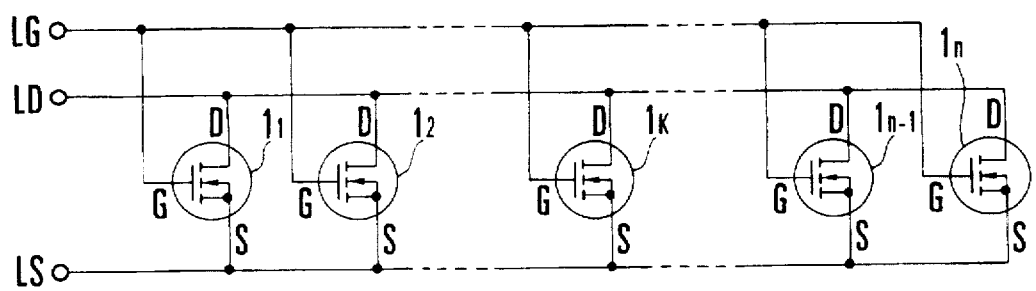
FIG. 13 is a circuit diagram showing the arrangement of a conventional power MOSFET.

FIG. 1 shows the arrangement of a power MOSFET according to an embodiment of the present invention. Referring to FIG. 1, MOSFETs 15 and 16 used in a rectifying circuit like the one shown in FIG. 12 are constituted by many small MOSFETs $1_1$ to $1_n$ whose drains D and sources S are connected in parallel between a drain interconnection (or a common drain terminal) LD and a source interconnection (or a common source terminal) LS. Switches $2_1$ to $2_n$ are respectively connected to gates G of the small MOSFETs $1_1$ to $1_n$ to selectively connect each gate G to the source S side or the gate interconnection (or the common gate terminal) LG side. In addition, this arrangement includes a selection circuit 3 for selectively ON/OFF-controlling the switches $2_1$ to $2_n$.

Figure 2:
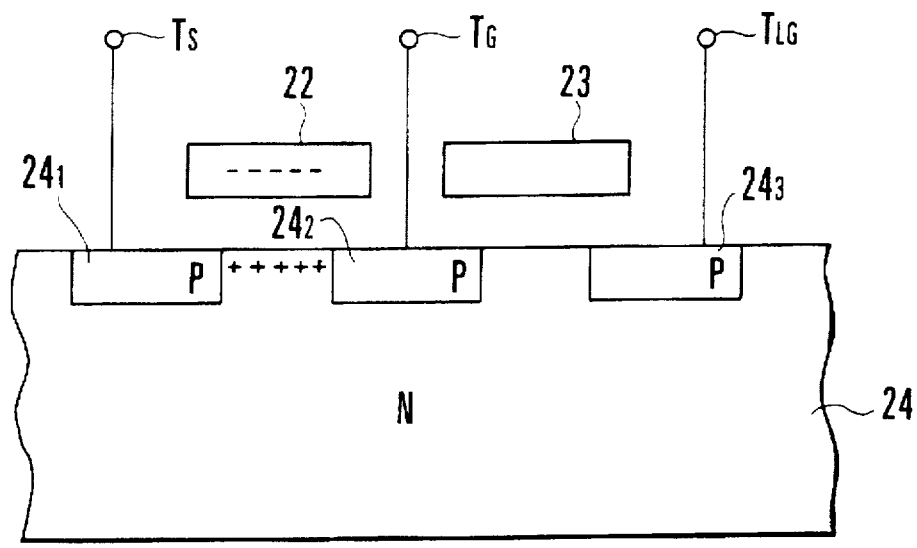
FIG. 2 is a sectional view showing the arrangement of a switch of the power MOSFET according to the present invention.

FIG. 2 shows the arrangement of each of the switches $2_1$ to $2_n$. Referring to FIG. 2, three p-type regions $24_1$, $24_2$, and $24_3$ are formed on the surface of a n-type silicon substrate 24. Floating gates 22 and 23 are formed on portions located above the n-type silicon substrate 24 and opposing the n-type region. Note that a source terminal TS connected to the source S in FIG. 1 is formed in this p-type region $24_1$, a gate terminal TG connected to the gate G is formed in the p-type region $24_2$, and a gate interconnection terminal TLG connected to the external gate interconnection LG is formed in the p-type region $24_3$.

In this case, the floating gate 22 is negatively charged, whereas the floating gate 23 is not charged.

In this arrangement, a positive charge is induced in the n-type region opposing the floating gate 22 to electrically connect the source terminal TS connected to the source S in FIG. 1 to the gate terminal TG connected to the gate G. As a result, the gate G of each of the small MOSFETs $1_1$ to $1_n$ has the same potential as that of the source S. On the other hand, since no charge is induced in the p-type region opposing the floating gate 23, the gate terminal TG connected to the gate G is insulated from the gate interconnection terminal TLG connected to the gate interconnection LG. As a result, the gate G of each of the small MOSFETs $1_1$ to $1_n$ is disconnected from the external interconnection LG, and the overall capacitance between the gates G and the sources S decreases. Note that the above relationship in charge exchange and connection with respect to the floating gates 22 and 23 can be established by using a general EEPROM technique.

Figure 3:
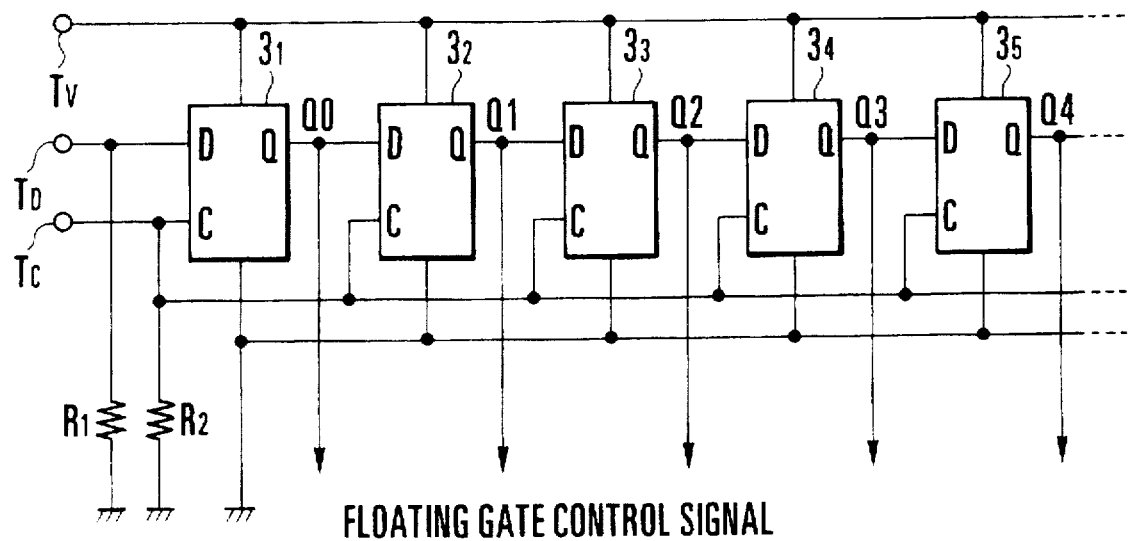
FIG. 3 is a circuit diagram showing the arrangement of a selection circuit in FIG. 1.

FIG. 3 shows the arrangement of the selection circuit 3. Referring to FIG. 3, the selection circuit 3 is constituted by a plurality of flip-flop circuits $3_1$ to $3_5$ connected in parallel between a power input terminal TV and a clock signal input terminal TC. Control signals Q0 to Q4 for choosing between permission to charge the floating gates 22 and 23 and inhibition thereof are respectively output from the output terminals of the flip-flop circuits $3_1$ to $3_5$ on the basis of program data corresponding to the number of MOSFETs to be used and input to a data signal input terminal TD.

Figure 4:
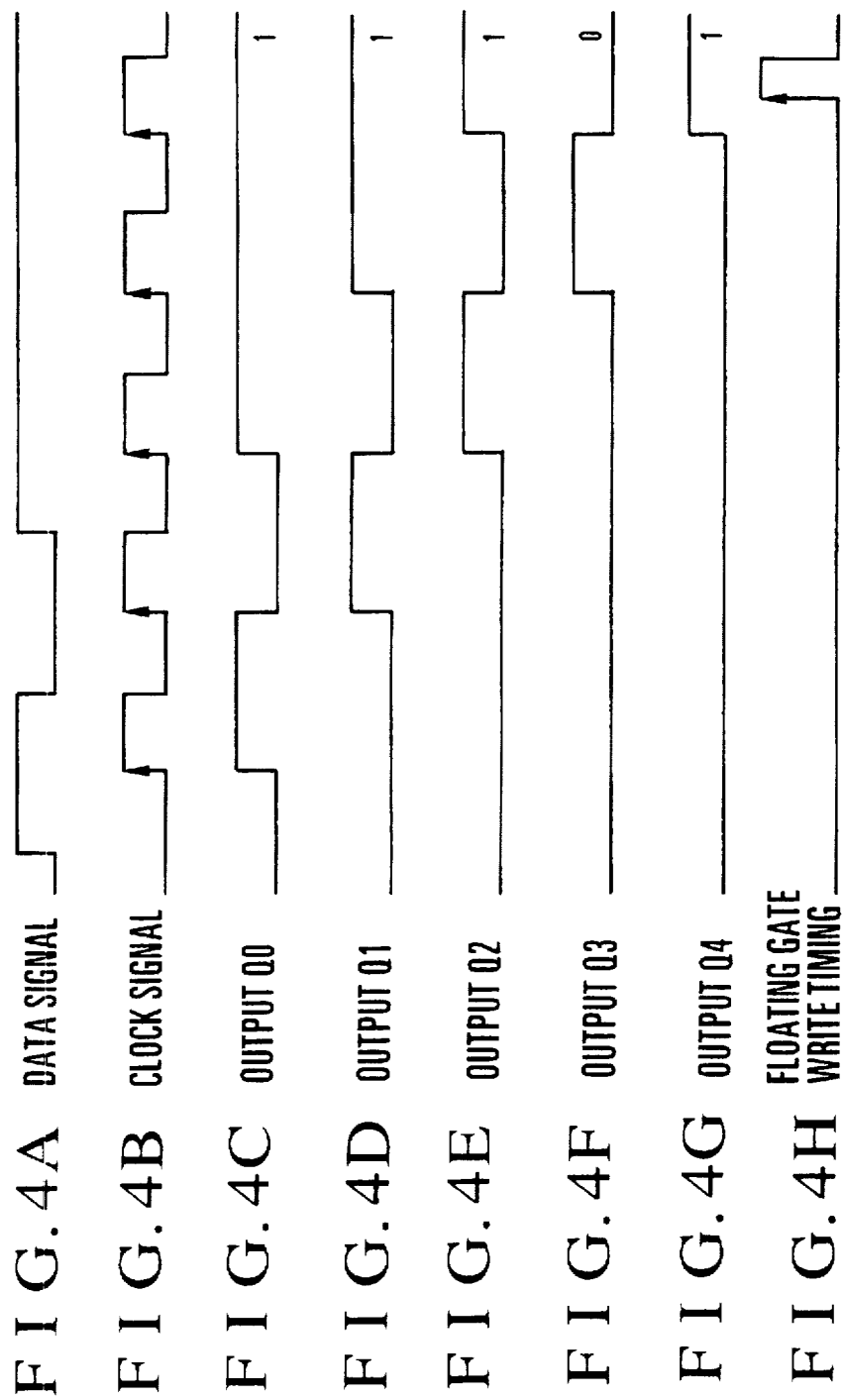
FIGS. 4A to 4H are timing charts for explaining the operation of the selection circuit.

In this arrangement, as indicated by the operation timings in FIG. 4, if the floating gate control signals Q0 to Q4 are at logic "1" when the floating gate write timing signal is set at "H" level, the gates G of the small MOSFETs $1_1$ to $1_5$ are connected to the gate interconnection LG side. If these control signals are at logic "0", the gates G are connected to the source interconnection LS.

As described above, a loss W1 caused by the ON resistance between the drain D and the source S is given by $$W1 = 12^2(RON \cdot 1/n) \tag{1}'$$

A loss W2 caused by the capacitance between the gate G and the source S is given by $$W2 = (Cin' \cdot n) \cdot V2^2 f \tag{2}'$$

Figure 14:
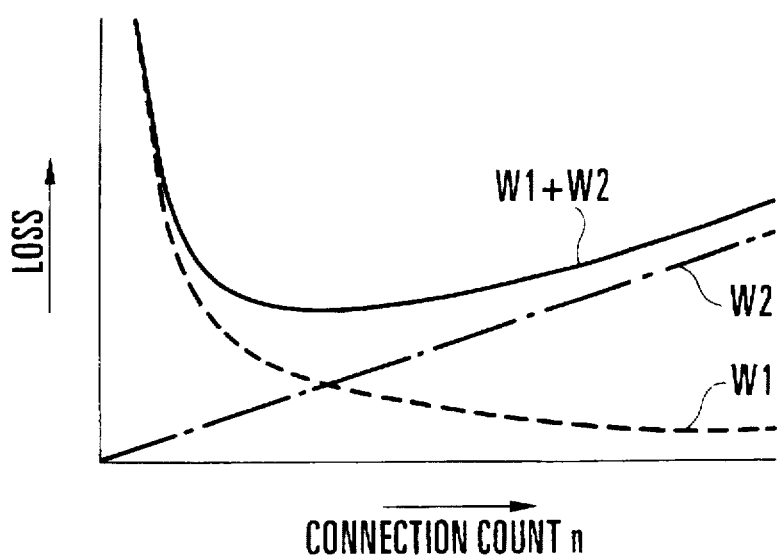
FIG. 14 is a graph showing the relationship between the loss and a connection count in the conventional power MOSFET.

As shown in FIG. 14, the value of loss W1+loss W2 is minimized according to the value of a connection count n. If, therefore, the selection circuit 3 selectively controls permission/inhibition of charging of the floating gates 22 and 23 in accordance with data programmed to operate the number of small MOSFETs that can minimize the loss, an optimal number of small MOSFETs are selected and connected to form a switching power circuit having a high power efficiency.

FIG. 5 shows the relationship between the loss and a connection count of the small MOSFETs $1_1$ to $1_n$ when a voltage V2 between the gate G and the source S is high. Referring to FIG. 5, the gradient of the loss W2 is larger than that in FIG. 14. In this case, as is apparent, the minimal point at which the value of loss W1+loss W2 is minimized comes at the count n smaller than that in FIG. 14. The selection circuit 3 therefore selects the count n of small MOSFETs which corresponds to this minimal point.

FIG. 6 shows the relationship between the loss and a connection count of the small MOSFETs $1_1$ to $1_n$ when a current I2 flowing in the secondary side rectifying circuit is large. Referring to FIG. 6, the value of the loss W1 is larger than that in FIG. 14. In this case, as is apparent, the minimal point of the value of loss W1+loss W2 comes at the count n larger than that in FIG. 14. The selection circuit 3 therefore selects the count n of small MOSFETs which corresponds to this minimal point.

Figure 7:
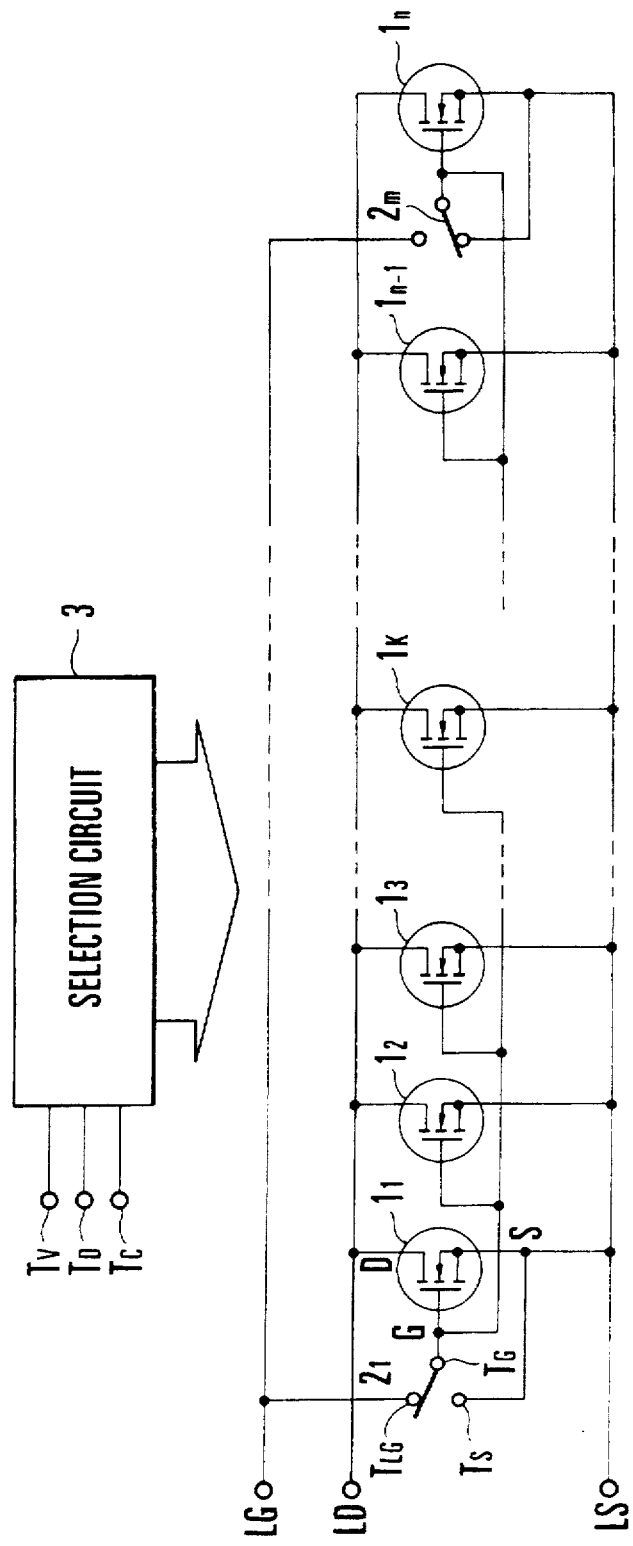
FIG. 7 is a circuit diagram showing the arrangement of a power MOSFET according to another embodiment of the present invention.

In the above embodiment, the switches $2_1$ to $2_n$ are respectively provided for the n small MOSFETs $1_1$ to $1_n$, and these MOSFETs are selected by the selection circuit 3. However, the present invention is not limited to this arrangement. As shown in FIG. 7, the small MOSFETs $1_1$ to $1_n$ may be grouped into a plurality of blocks, and switches may be provided for the respective blocks. The blocks may be selected by the selection circuit 3. For example, one switch $2_1$ may be provided for one block of small MOSFETs $1_1$ to $1_k$ connected in parallel with each other, and one switch $2_m$ may be provided for the other block of small MOSFETs $1_{n-1}$ to $1_m$. The blocks may be selected by the selection circuit 3.

A case wherein small MOSFETs formed on a chip T are grouped into a plurality of blocks will be described below with reference to FIGS. 8A to 8I. Referring to FIGS. 8A to 8I, the chip T is divided into seven blocks A0, A1, A2, A3, A4, A5, and A6, and the block A6 is regarded as one unit. In this case, the areas shown in FIGS. 8A to 8I, i.e., the areas of small MOSFETs to be operated, are defined as follows: 64 in FIG. 8A, 32 in FIG. 8B, 16 in FIG. 8C, 8 in FIG. 8D, 48 in FIG. 8E, 40 in FIG. 8F, 56 in FIG. 8G, 41 in FIG. 8H, and 22 in FIG. 8I. That is, the area can be changed in 65 steps from 0 to 64.

According to such an arrangement, as shown in FIG. 9A, since gates $G_0$ to $G_6$ can be formed in accordance with the number of small MOSFETs which can be simultaneously operated, the number of small MOSFETs which are simultaneously operated can be set. In addition, a chip structure like the one shown in FIG. 9B can be formed.

According to this arrangement, the areas of MOSFETs which are simultaneously operated can be selected in multiple steps with the minimum number of switches. When gates S of all small MOSFETs are to be selected/controlled, a large number of switches are required. With this arrangement, however, the areas of small MOSFETs which are simultaneously operated can be selected in multiple steps with the minimum number of switches.

Figure 10:
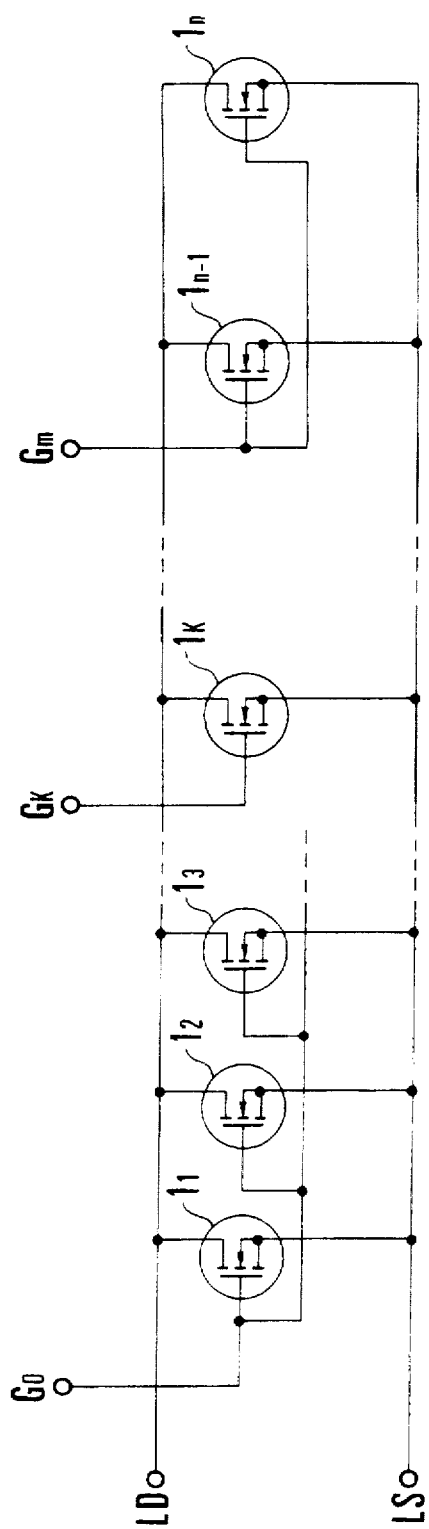
FIG. 10 is a circuit diagram showing the arrangement of a power MOSFET according to still another embodiment of the present invention.
Figure 11:
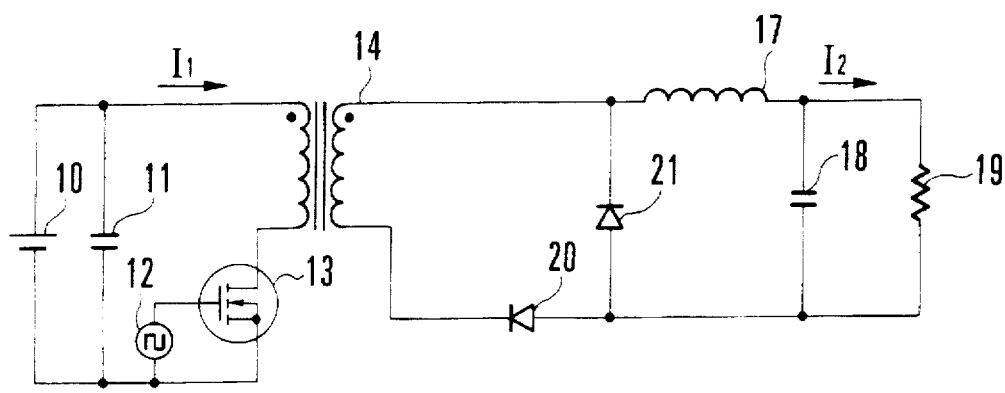
FIG. 11 is a circuit diagram showing the arrangement of a conventional switching power supply using a general diode as a rectifying device.

In the above embodiment, switches are provided for the respective blocks of small MOSFETs. However, as shown in FIG. 10, an output from a gate G may be extracted outside each block, and only necessary gates G may be used.

As has been described above, according to the present invention, programming can be performed such that only an optimal number of MOSFETs of many small MOSFETs connected in parallel with each other are operated in accordance with various application purposes. A switching power supply having a high efficiency can therefore be realized by setting the number of MOSFETs that can improve the power efficiency.

In addition, according to the present invention, the number of MOSFETs which are simultaneously operated can be changed in accordance with various application circuits. Standardization can therefore be realized, and a reduction in cost can also be attained.

What is claimed is:

1. A power MOSFET comprising:
   common source and drain terminals to which sources and drains of a plurality of insulated gate field-effect transistors are respectively connected in parallel; and
   selection means for selectively connecting gates of said insulated gate field-effect transistors to one of a common gate terminal and said common source terminal, wherein each of said plurality of insulated gate field-effect transistors receives a common gate signal applied to said common gate terminal.

2. The power MOSFET of claim 1, wherein said plurality of insulated gate field-effect transistors are grouped into blocks, each of said blocks having a common block gate formed by interconnecting gates of insulated gate field-effect transistors grouped in said each block, said selection means selectively connecting the common block gates to one of said gate common terminal and said common source terminal.

* * * * *